(12) United States Patent
Roberts et al.

(10) Patent No.: US 7,076,014 B2
(45) Date of Patent: Jul. 11, 2006

(54) PRECISE SYNCHRONIZATION OF DISTRIBUTED SYSTEMS

(75) Inventors: Keith Michael Roberts, Chester, NY (US); Stephen C. Ems, Sloatsburg, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 813 days.

(21) Appl. No.: 10/013,600

(22) Filed: Dec. 11, 2001

(65) Prior Publication Data

US 2003/0107417 A1 Jun. 12, 2003

(51) Int. Cl.
*H04L 7/00* (2006.01)
(52) U.S. Cl. ............... 375/356; 375/371; 327/149; 327/150; 327/151; 327/159; 370/517
(58) Field of Classification Search ............... 375/354, 375/356, 371, 373; 327/141, 149, 150, 151, 327/159–161; 370/503, 507, 516, 517; 713/400, 713/500, 600
See application file for complete search history.

(56) References Cited

U.S. PATENT DOCUMENTS

| 3,778,550 | A | | 12/1973 | David et al. |
| 5,062,124 | A | * | 10/1991 | Hayashi et al. ............. 375/356 |
| 5,111,486 | A | | 5/1992 | Oliboni et al. |
| 5,790,608 | A | * | 8/1998 | Benayoun et al. .......... 375/356 |
| 6,021,504 | A | * | 2/2000 | Yamasaki .................... 713/400 |
| 6,188,286 | B1 | | 2/2001 | Hogl et al. |

* cited by examiner

*Primary Examiner*—Dac V. Ha
(74) *Attorney, Agent, or Firm*—Frommer Lawrence & Haug LLP; William S. Frommer

(57) ABSTRACT

A method for synchronizing a plurality of sub-systems, comprising the steps of measuring a relationship between a divider associated with each of the plurality of sub-systems; and adjusting a phase of one or more of the dividers to a known relationship with one of the dividers. A command is issued synchronous to a divider associated with one of the plurality of sub-systems. The command is received at one of the sub-systems and is acted upon synchronous to a divider associated with the one of the sub-system receiving said command.

19 Claims, 5 Drawing Sheets

PRECISE SYNCHRONIZATION OF DISTRIBUTED SYSTEMS

BACKGROUND OF THE INVENTION

In many systems it is necessary to start or stop the system, or otherwise act on a specific command or signal at a very precise time. However, this precise synchronization of all of the various components of a complicated system is often very difficult to achieve. Therefore, it would be beneficial to provide an improved method and apparatus for achieving such synchronization.

SUMMARY OF THE INVENTION

Therefore, in accordance with the invention, rather than interpreting commands precisely in time, a calibration process is used to insure that actions are performed only at certain specific times that are in turn spaced by an interval sufficient to guarantee that commands can be issued unambiguously.

A particular application to which this method and apparatus can be applied is to the starting and stopping of a digital oscilloscope across multiple converters. In accordance with such an application, a series of sub-systems each contain a divider that divides down to an appropriate clock speed what will be described as a high-speed clock. Each sub-system is capable of starting, stopping or otherwise acting in accordance with an appropriate signal or encoded command. The sub-system will only perform this action at an edge of a pulse of the high-speed clock corresponding to a specific phase of the divider. At this specific phase, a low fidelity logic input is sampled or alternatively a previously queued command executed. This allows the timing of logic input or encoded command's timing to be much less critical than that of the original clock.

In order for this invention to operate it is necessary to either know the dividers are running in phase or at least have knowledge of their relative phases. The invention combines two stages. First the relationship (initially arbitrary) of the dividers is determined. In a second stage, the phases are adjusted to be synchronized. Once these phases are adjusted it is possible to communicate a command with an imprecise signal (either a logic signal or encoded message) that is not acted upon until a specific synchronized edge of the dividers in each sub-system is reached. The action will be carried out on a specific edge of the high-speed clock corresponding to the adjusted divider phase in each sub-system.

Two alternative techniques may be employed for measuring the relative phase of the dividers. A first is based on a direct measurement. The second uses the analog input of a digitizer sub-system or an analog trigger sub-system to measure the phase of that subsystem's divider relative to its input signal. For a digitizer, this is achieved by recording the phase of the divider together with the digitized signals. As an example, this can be achieved by using the divider to provide the least significant bits of a sample number expressed in binary. For an analog trigger the time between the input signal and a specific phase of the divider is determined. By processing the digitized samples or trigger time the relationship between each divider phase and its analog input can be determined after the fact.

For the adjustment phase, one technique that may be employed is to gate off a predetermined number of clock pulses to the divider to cause its phase to be retarded a known amount. To those skilled in the art a number of alternative schemes may also be employed.

Other systems have employed a number of techniques in order to synchronize various components. In some systems, the clock for each component system is stopped and then started from a common source. The first edge of this interrupted stream is used by the various receiving systems as a common time mark that all subsequent times can be related to. The advantage of this system is that only one high quality signal (the clock) need be distributed. The disadvantage is that it is more difficult to preserve the signal fidelity of a clock when it must be started and stopped compared to a continuous clock. A variant of this scheme is to use the last clock edge as a marker.

In accordance with another technique that has been employed, an enable indication is transmitted to both receiving sub-systems which operate from clocks that have been provided from a common source. This signal must meet specific setup and requirements at both receiving systems. The disadvantages of this system are that an accurate setup and hold relationship must be maintained between the clock and this signal, and therefore the two signals must be transmitted with very high fidelity. For a very high-speed system it is frequently also necessary to provide programmable timing adjustments of the relationship between the enable signal and the clock that are difficult to calibrate. If the clock frequency is not constant, it becomes necessary to ensure that propagation delay of the enable signal and clock are matched so that the setup and hold time can be met for all clock frequencies.

In accordance with a further technique that has previously been employed, a lower frequency clock is distributed to the various sub-systems. The enable signal is distributed synchronous to this clock. In addition, a higher frequency clock is generated locally at each sub-system by a variety of standard techniques including a PLL or a frequency multiplier. The disadvantage is that the frequency multiplication can be very costly to achieve sufficient performance for the application.

An object of this invention is to therefore provide an appropriate synchronization capability without the need to interrupt the clock and also without the need for a precisely timed command channel to communicate the command.

Still other objects and advantages of the invention will in part be obvious and will in part be apparent from the specification and the drawings The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

In order to describe the functioning of this invention, an analogy will first be employed. The analogy begins with a group of individuals, each with a cannon, and each having a reliable timepiece (i.e. keeps accurate time once operating), none of which are set to the correct time. Each of the individuals is located a significant distance from the others and hence voices take some time to carry between the individuals. The individuals all wish to fire their cannons precisely on the hour (to the nearest second) but only at certain hours (as instructed) that cannot be predetermined.

Any of the individuals that wishes to send information carries out a series of experiments with the individuals that want to receive the information. For example, a click is transmitted every second from an arbitrary location. These clicks are used by all timepieces to advance their second hands, one second at a time. This guarantees that the individual's timepieces do not shift relative to each other during the experiment. However, this information alone is not sufficient to know the actual time. Further experiments are performed to achieve this synchronization. These experiments for synchronization may be of two possible types.

First, the individuals may come together and check that their watches show the correct time. If not, the watches are adjusted. After having synchronized their watches, the individuals return to their cannons. An alternative approach is for one individual to launch a series of flares set to explode at exactly 12:00 each day (according to his timepiece) and the receiver averages his measurement error to allow a very precise setting of his timepiece to match the sender's timepiece. For the sake of this analogy the time of transit of the light can be neglected. The technique employed for adjusting an individual's watch is to either freeze the watch for a few seconds to retard the time if it was previously fast by only a small amount, or alternatively to make a major adjustment.

After calibration and synchronization, and during operation, at around 30 minutes after the hour (or any other time sufficiently distant from the hour mark), the sender (one of the individuals) shouts instructions whether or not to fire all of the cannons at the next hour. Each receiver (other individuals) hears this instruction and makes preparations to fire that individual's cannon precisely at the following hour. One great advantage is that timing of the communication of the verbal fire instructions is not critical to the accurate firing of the cannon. The limitation is that the cannon can only be fired on the hour.

In the description of the invention below, the timepiece of the analogy corresponds to the divider and the time shown on the timepiece in the analogy corresponds to the phase of the divider.

Figure 1:
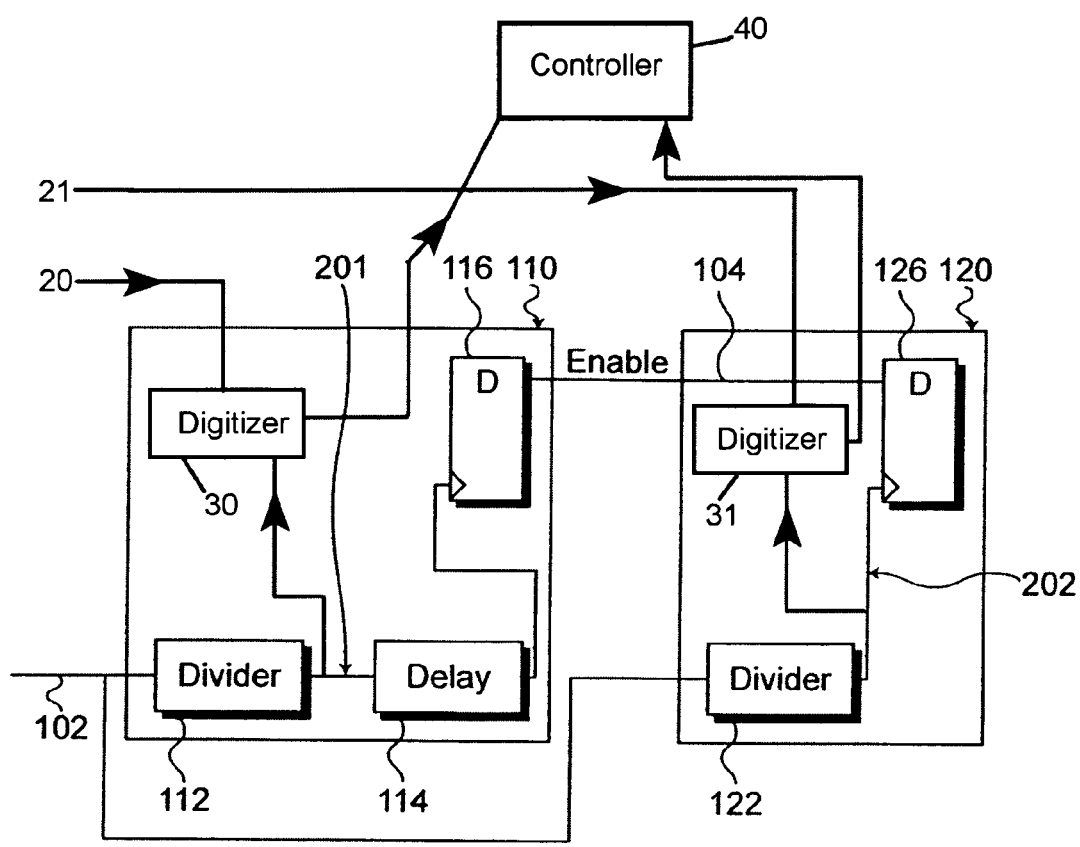
FIG. 1 depicts two sub-systems sharing a common clock.

Referring first to FIG. 1, two sub-systems 110 and 120 are shown. Sub-system 110 comprises a divider 112, a delay element 114 and a signal generator 116. Sub-system 120 includes a divider 122 and a signal generator 126. A clock signal 102 is input to dividers 112 and 122 while an enable signal 104 is generated at signal generator 116 synchronous to (but delayed from) divider 112 and forwarded to signal generator 126 to be acted upon synchronous to divider 122. Delay element 114 is chosen to allow safe communication once dividers 112 and 122 are correctly aligned, as will be discussed below.

In accordance with the invention, a continuous clock 102 is applied at each receiving system to be synchronized. The clocks must have the same frequency and a constant arbitrary phase relationship. This clock could be multiplied at each receiving system to generate other synchronized frequency clock signals. However, this invention is only useful if such a multiply factor is not an integer multiple of the divide ratio discussed below.

As noted above, each sub-system incorporates a divider (112, 122) that produces a lower frequency clock based upon the continuous clock 102. The choice of this divide ratio at each sub-system is a compromise between two requirements. The larger the division ratio, the greater apart in time the instants that markers could be potentially acted upon because there will be fewer repeats of the divider phase per unit time. The shorter the division ratio, the greater time precision must be used to transmit a command to be acted upon because the time defined by the spacing between repeats of the divider phase are spaced closer in time. Initially, the phases of these dividers are arbitrary (determined during power up). The divider incorporates a mechanism that allows its phase to be adjusted. An example of such a mechanism includes a gating circuit that suppresses clock cycles, thus delaying its phase by a predefined number of the original clock cycles. A variety of other schemes to implement this function may be envisioned by those skilled in the art.

Figure 2:
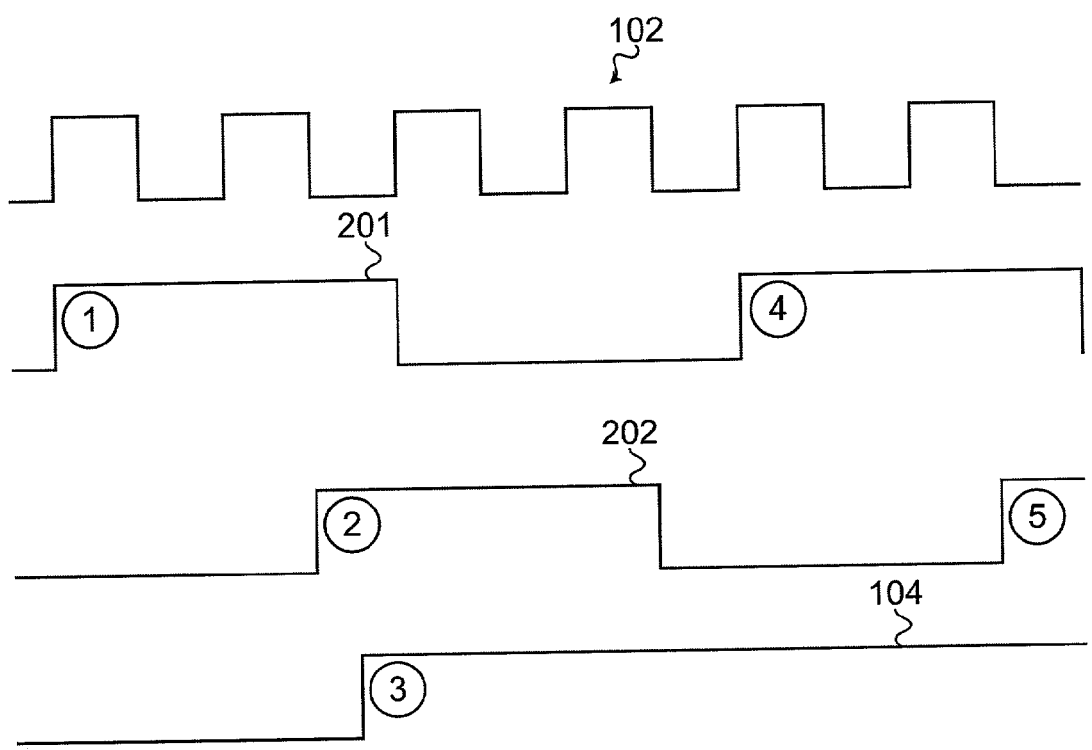
FIG. 2 depicts a plurality of waveforms generated in accordance with the sub-systems of FIG. 1.

FIG. 2 depicts a plurality of signals generated by the sub-systems depicted in FIG. 1. As is shown, divider 112 generates a signal 201 synchronous to an edge of clock signal 102. It is at this edge of signal 201 (points 1 or 4) that an action can be performed. Divider 122 generates a signal 202 also synchronous to an edge of clock signal 102. It is at this edge of signal 202 (points 2 or 5) that an action can be performed. However, because the phases of dividers 112 and 122 do not match, signal 201 at points 2 and 5 from divider 122 is generated at a falling edge of clock signal 102, positioned apart from points 1 and 4 of signal 201. Once the enable signal 104 is generated in accordance with signal 1 at point 3, an anticipated time of action 4 is determined. While first sub-system 110 can act at this intended time, because of the incorrect phase between dividers 112 and 122, sub-system 120 can only act at signal point 5, on a tracking edge of clock signal 102, and after the intended time of action 4. Thus, synchronization of dividers 112, 122 is required, and would result in a proper implementation of the command in sub-system 120.

In accordance with the invention, the phase error between dividers of the various sub-systems must be determined by one of several methods before they can be synchronized. Two example techniques that may be employed will now be described:

In the first technique, outputs synchronous to the individual dividers are routed to one or more circuits that make relative phase measurements. The measurement accuracy needs to be accurate to less than 1 cycle of the undivided clock. This can be achieved either with a single high fidelity measurement or alternatively with a series of lower fidelity measurements. A number of techniques are well known by those skilled in the art to implement phase meters or Time to Digital Converters can be used to achieve this measurement.

In the second technique, if the transmitter and receiver have other suitable inputs, these can also be used to make the phase measurement. For example, with a digitizer in both sub-system 110 and sub-system 120 of FIG. 1, such as digitizers 30 and 31 ,(or with an analog trigger system) an analog input is available, such as analog inputs 20 and 21. As each digitizer must employ a defined start time as defined by its associated divider, relative phase shifts between the dividers will be manifested as phase differences in the digitized signals produced by the digitizers. Therefore signals with known phase relationships are applied to each input 20, 21. Examination of the digitized waveforms, such as by a controller, for example, controller 40, allows the relationship between the waveform timing of each of the digitized signals produced by digitizers 30 ,31 and thus the divider phase, to be determined for each subsystem. This determined relationship (which is the apparent phase shift) can then be used by controller 40 to adjust the phase of the dividers 112, 122 such as by a technique of the invention described above. For an analog trigger a direct measurement of an input signal to the divider phase can be made with a TDC. Again this can be performed on a single high fidelity signal waveform edge or a series of lower fidelity signal waveform edges.

In either case, once the phase differences between the various dividers are known, they are adjusted to a known relationship. This calibration process need only be repeated when it is believed that the circuitry may have drifted (e.g. due to a change in temperature or the like).

Figure 3:
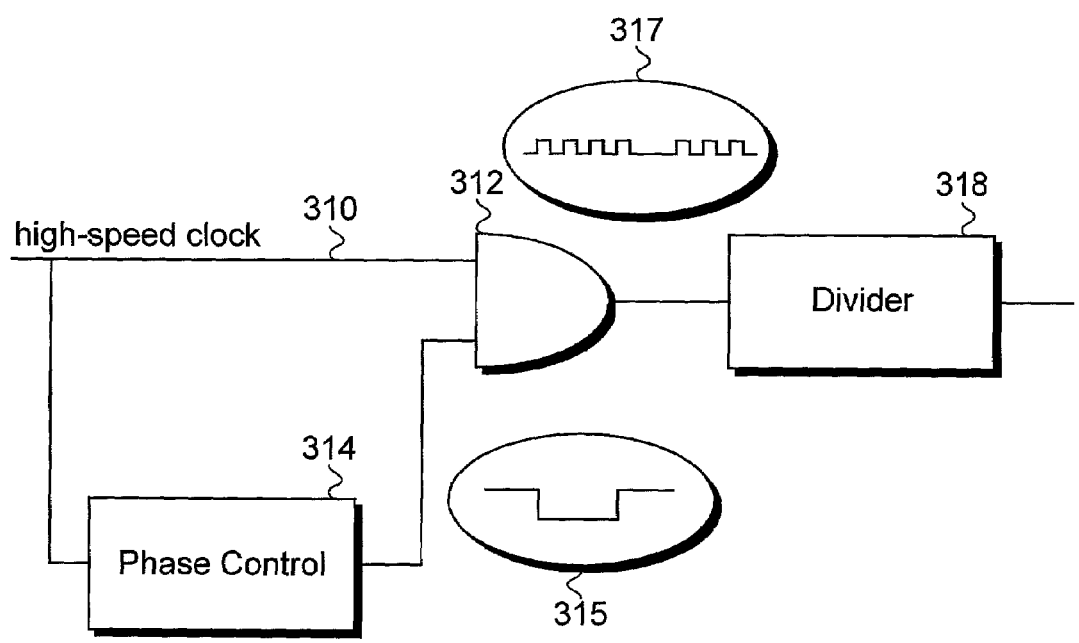
FIG. 3 illustrates a gated clock approach for controlling the phase of a divider in accordance with the invention.

A number of techniques are well known by those skilled in the art to implement the adjustment. One such technique is depicted in FIG. 3.

A high-speed clock 310 is input to an appropriate gate 312. A phase control element 314 provides a signal 315 to gate 312 to retard the phase of a divider 318 to be able to synchronize the divider with the divider of other sub-systems. Therefore, when phase control 314 transmits signal 315 to gate 312, a complete clock cycle is removed from high-speed clock signal 310. Thus, a modified waveform 317 is forwarded to divider 318, rather than high-speed clock signal 310 in its entirety. Because a clock cycle is missing, the timing of divider 318 will be retarded by one clock cycle. Any number of clock cycles may be removed to synchronize the phase of dividers (12, 122).

The system is now ready for regular operation. In operation a command is transmitted to each of the individual sub-systems via a logic signal or encoded message. The time of arrival of this command is not critical, as it will not be acted on until the specific phase of the divider for the particular sub-system is reached. In fact it is only necessary that the enable (or marker) signal is generated by a common source on its divided clock and them sampled on all destination systems synchronous to each system's divided clock. By correct alignment of the dividers, the enable signal can easily meet the requirements for the setup and hold times of the receive systems without requiring any precise timing regarding the transmission of this signal.

Figure 4:
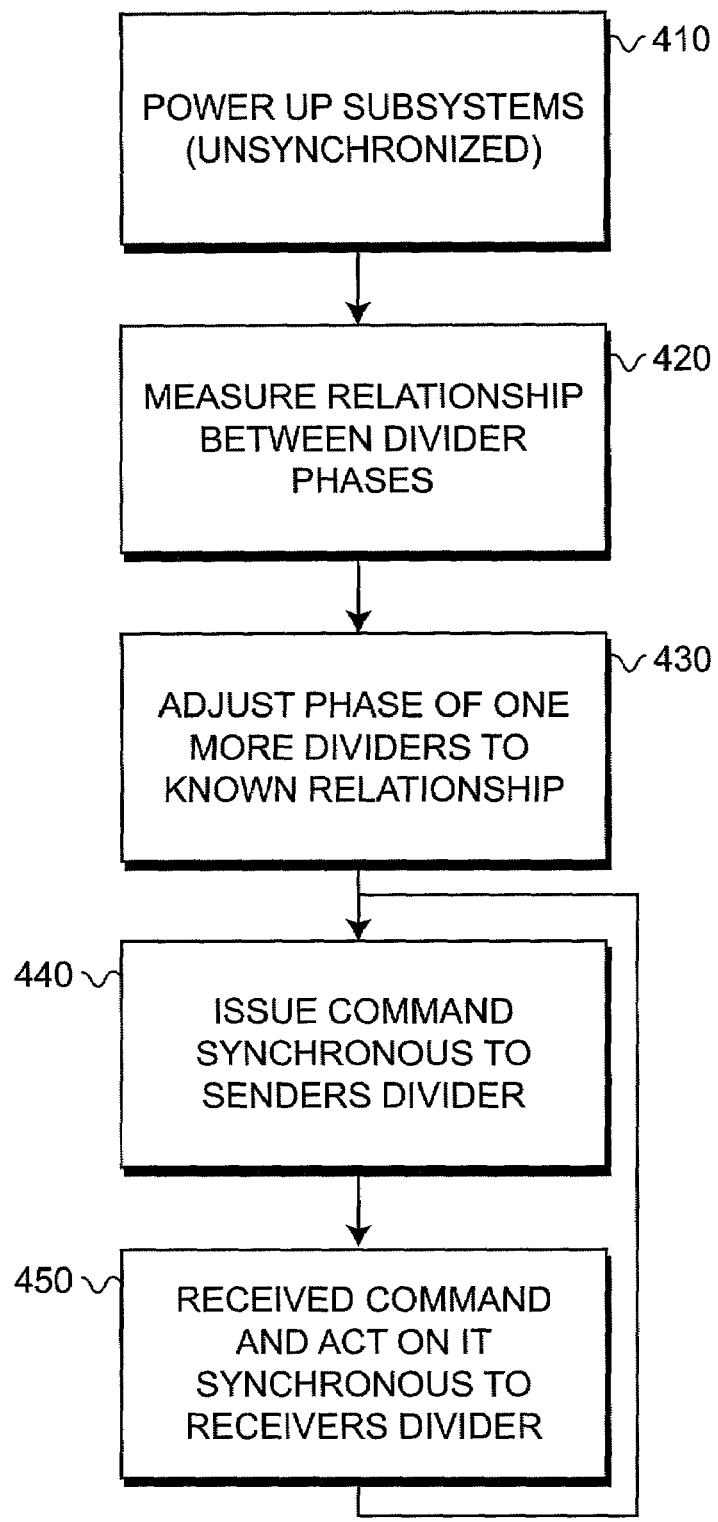
FIG. 4 is a flow chart diagram depicting a method for setting up and issuing synchronized commands in accordance with the invention.
Figure 5:
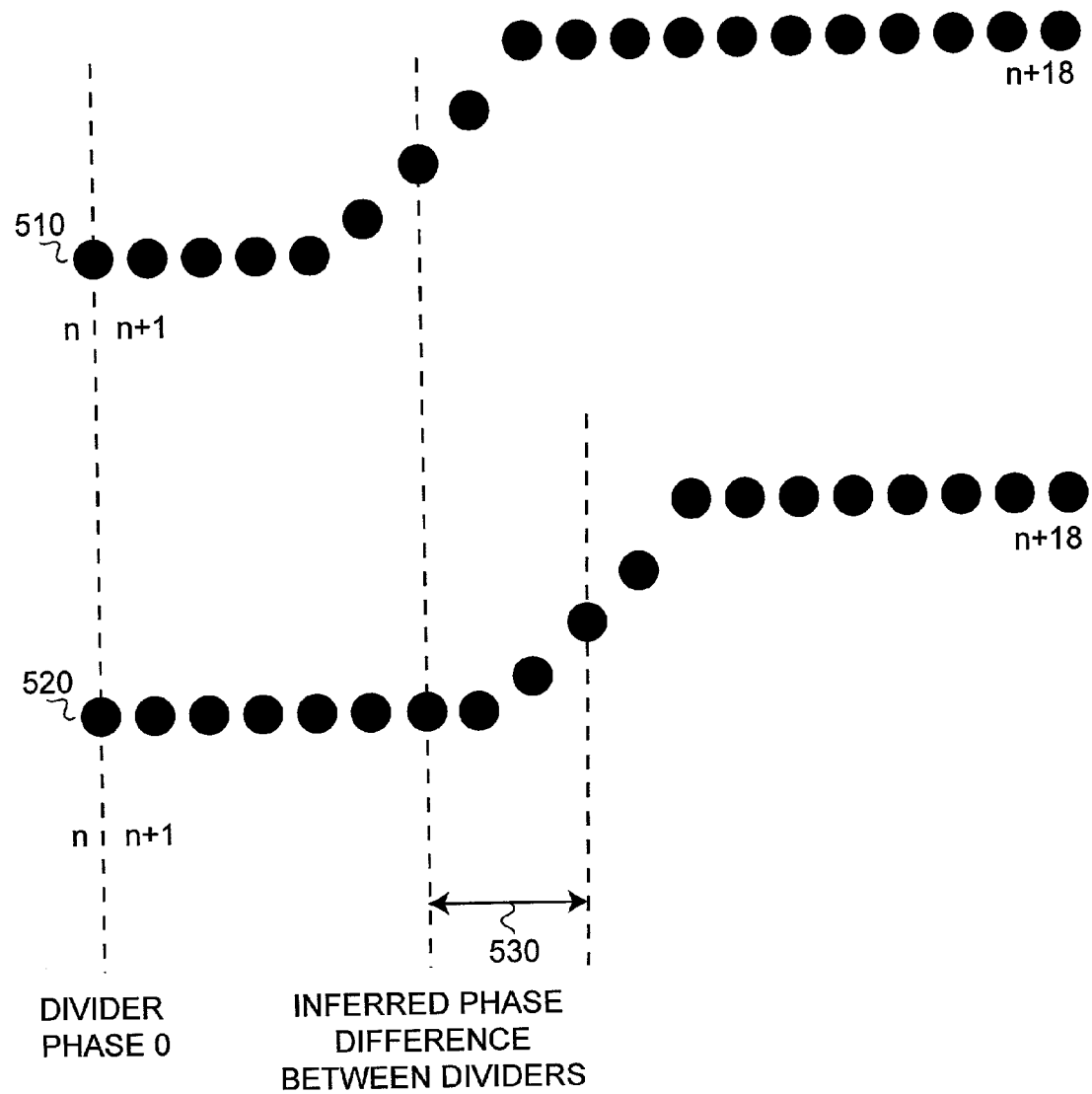
FIG. 5 depicts the use of a delay measurement on an oscilloscope to measure the relative phase of two converters.

Therefore, calibration and operation of a system in accordance with the invention is shown in FIG. 4. At step 410 the various sub-systems to be utilized are powered up. At this time, the sub-systems are unsynchronized. Then, at step 420 the relationship between divider phases is measured. One technique for this process is performed in accordance with the graph shown in FIG. 5. First, an identical waveform including an identical edge is input to two digitizer channels (510, 520). When the digitizer channels (510, 520) are compared, they exhibit a phase difference 530. This phase difference is generated because the technique used to relate the waveforms assumes the dividers are aligned. The differences in the phase between the dividers can be measured as the apparent delay (530) between the two waveforms.

Returning to FIG. 4, once the phase relationship between the dividers has been determined, the phase of one or more of the dividers is adjusted to a known relationship, using the techniques discussed above at step 430. This completes setup.

During use, at step 440 a command is issued synchronous to the divider of the sending sub-unit. At step 450, the issued command is received and acted upon synchronous to the receiver's divider. Because of the prior synchronization, the command will be implemented synchronously on all of the synchronized sub-systems.

Another variation of this invention would allow the command to contain a request to be acted upon at a specific phase of the divider. Again, however, exact arrival time of the command would not be used to determine the execution time. Rather, the execution time is determined when the divider hits the appropriate phase.

Therefore, one important feature of the invention is that the timing of implementation of a command or mark communicated by the command is not dependent on the precision of the timing of the transmission of the command or marker signal itself. It will only be sampled and implemented at a specific phase of the divider. Assuming the divider phases are known, the exact moment this marker or command will be implemented is a specific edge of a clock signal determined by the divider, and not the time of arrival of the command.

An example of an apparatus that may employ this invention includes a Digital oscilloscope. In such a digital oscilloscope, several different receive sub-systems (digitizer channels+trigger channel ) operate in accordance with a sampling clock that is input to the above sub-systems. These sample clocks do not have to be in phase since we can adjust the phases independently. In a digital oscilloscope, it is important to ensure that the system can reliably match the clock cycle used to start and stop the acquisition record on each digitizer and the trigger for each of the different receive signals. This is necessary to ensure that the waveforms can be aligned (after the fact) correctly relative to the trigger so that properly synchronized data may be used in various calculations and may be displayed.

If the second technique described above is chosen for use with a digital oscilloscope, the required experiments can be performed employing the normal delay calibration of such an oscilloscope. A calibration waveform (for example a square wave, sine wave or any other appropriate waveform) is thus applied to the analog inputs of all the input channels and the trigger channel. The trigger channel issues a stop signal to the digitizers synchronous to its divided down clock. The channels all stop randomly as the phases of the dividers in the various channels (receive systems) at this point are arbitrary. By looking at the recording waveforms and the time of arrival of the trigger, it is possible to determine very precisely the time offset of each of the dividers relative to the trigger as it is directly related to the phase of the digitized waveform relative to the divider at the moment the stop command was executed. This information is then used to adjust the phase of the dividers to synchronize them. This adjustment can be an integral number of clocks and in addition finely variable using any kind of delay element. When the next trigger is processed, all the channels are stopped precisely synchronized with the waveform. For many applications this will be the same point on each waveform, though for interleaved applications, the exact phasing of the dividers may be deliberately shifted by a fractional or integer number of sampling periods to adjust the relative timing of the converters. In the digital oscilloscope application it may be necessary to generate two time marks. The first is used to start the decimators on each converter with the correct phase relationships. This mark must be issued at or before any arming of the acquisition system. The second time mark is generated some time after the trigger occurs and causes the end of the record to be marked or the acquisition system to be stopped. It is possible but not necessary to encode this information in a single logic signal, e.g. the rising and falling edges thereof.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A system comprising a plurality of sub-systems desired to be operated synchronously, each of said plurality of sub-systems comprising:
   a divider for dividing a received clock signal and generating a signal including a plurality of clock signal edges, a phase of said signal issued from said divider being adjustable based upon an indirect comparison with a phase of a signal issued from a divider of another of said plurality of sub-systems;
   a receiver for receiving a command to be implemented by at least one of said plurality of said sub-systems; and
   a control mechanism for implementing said received command at a predetermined one of said plurality of clock signal edges;
   wherein a phase measurement of an independent analog input relative to the divider of each sub-system is used to determine a phase difference therebetween.

2. The system as described in claim 1, wherein a variation of a delay calibration routine is used to determine the relative phase of each divider.

3. The system as described in claim 1, wherein an adjustment technique based on a gated clock is used to adjust the phase of the divider.

4. The system as described in claim 1, wherein a series of digitizers and an analog trigger are synchronized.

5. The system as described in claim 4, wherein a point in time specifically related to the trigger event is determined.

6. The system as described in claim 5, wherein said system is a digital oscilloscope.

7. The system as described in claim 4, wherein a decimator is started on a series of digitizer channels in phase.

8. A method for operating a system comprising a plurality of sub-systems synchronously, comprising the steps of:
   dividing a received clock signal and generating at each sub-system a signal including a plurality of clock signal edges, a phase of said signal issued from a divider of a first of said plurality of sub-systems being adjustable based upon an indirect comparison with a phase of a signal issued from a divider of another of said plurality of sub-systems;
   receiving a command to be implemented by said sub-system; and
   implementing said received command at a predetermined one of said plurality of clock signal edges;
   wherein a phase measurement of an independent analog input relative to the divider of each sub-system is used to determine a phase difference therebetween.

9. The method as described in claim 8, wherein a variation of a delay calibration routine is used to determine the relative phase of each divider.

10. The method as described in claim 8, wherein an adjustment technique based on a gated clock is used to adjust the phase of the divider.

11. The method is as described in claim 10, wherein an additional adjustment with a fine delay element is used to adjust the phase of the dividers to a fraction of the clock period.

12. The method as described in claim 8, wherein a series of digitizers and an analog trigger are synchronized.

13. The method as described in claim 12, wherein a point in time specifically related to the trigger event is determined.

14. The method as described in claim 12, wherein a decimator is started on a series of digitizer channels in phase.

15. The method as described in claim 8, wherein said system is a digitized oscilloscope.

16. A method for synchronizing a plurality of sub-systems, comprising the steps of:
   measuring a relationship between a divider associated with each of said plurality of sub-systems, wherein a phase measurement of an independent analog input relative to a the divider of each sub-system is used to determine the relationship therebetween;
   adjusting a phase of one or more of said dividers to a known relationship with one of said dividers;
   issuing a command synchronous to a the divider associated with one of said plurality of sub-systems;
   receiving said command at one of said sub-systems; and
   acting upon said command synchronous to the divider associated with said one of said sub-system receiving said command.

17. The method of claim 16, wherein said phase of said one or more of said dividers is adjusted by removing one or more pulses from a clock signal to be forwarded to said sub-system to receive said command so as to retard implementation of said command at said sub-system.

18. The method of claim 17, wherein said phase is further adjusted with a fine delay to adjust the phase of the dividers to a fraction of the clock period.

19. The system as described in claim 16, wherein the said system is a digital oscilloscope.

* * * * *

UNITED STATES PATENT AND TRADEMARK OFFICE
CERTIFICATE OF CORRECTION

PATENT NO. : 7,076,014 B2  
APPLICATION NO. : 10/013600  
DATED : July 11, 2006  
INVENTOR(S) : Keith Michael Roberts et al.

Page 1 of 1

It is certified that error appears in the above-identified patent and that said Letters Patent is hereby corrected as shown below:

Col. 8, line 36 (Claim 16)   - change "to a the" to --to the--.  
Col. 8, line 40 (Claim 16)   - change "to a the" to --to the--.

Signed and Sealed this

Twenty-fourth Day of October, 2006

JON W. DUDAS  
*Director of the United States Patent and Trademark Office*